US005666090A

United States Patent [19]

Tsuruoka

[11] Patent Number: 5,666,090

[45] Date of Patent: Sep. 9, 1997

[54] HIGH-FREQUENCY COUPLER

[75] Inventor: Yoshiyasu Tsuruoka, Kawasaki, Japan

[73] Assignee: Fujitsu Limited, Kanagawa, Japan

[21] Appl. No.: 747,935

[22] Filed: Nov. 12, 1996

Related U.S. Application Data

[63] Continuation of Ser. No. 519,967, Aug. 28, 1995, abandoned.

[30] Foreign Application Priority Data

Dec. 7, 1994 [JP] Japan .................................... 6-303925

[51] Int. Cl.[6] .................................... H01P 5/18

[52] U.S. Cl. .................................... 333/116; 333/238

[58] Field of Search .................................... 333/116, 238, 333/246

[56] References Cited

U.S. PATENT DOCUMENTS

| | | | |
|---|---|---|---|
| 4,011,528 | 3/1977 | Podell et al. | 333/116 |
| 4,150,345 | 4/1979 | Goldman et al. | 333/116 |
| 4,216,446 | 8/1980 | Iwer | 333/116 X |
| 4,375,054 | 2/1983 | Pavio | 333/116 X |
| 4,376,921 | 3/1983 | Dickens et al. | 333/116 |
| 4,482,873 | 11/1984 | Nyhus | 333/116 |
| 5,159,298 | 10/1992 | Dydyk | 333/116 X |
| 5,229,727 | 7/1993 | Clark et al. | 333/238 |
| 5,235,296 | 8/1993 | Saka | 333/116 X |
| 5,313,175 | 5/1994 | Bahl et al. | 333/116 |
| 5,369,379 | 11/1994 | Fujiki | 333/116 |

FOREIGN PATENT DOCUMENTS

| | | | |
|---|---|---|---|
| 0 298 434 | 7/1987 | European Pat. Off. . | |
| 0 518 423 | 12/1992 | European Pat. Off. . | |
| 117401 | 9/1981 | Japan | 333/116 |
| 61-116404 | 10/1984 | Japan . | |
| 63-45901 | 8/1986 | Japan . | |
| 2-87595 | 3/1990 | Japan . | |
| 5-14019 | 1/1993 | Japan . | |
| 5-83015 | 4/1993 | Japan . | |

OTHER PUBLICATIONS

R. R. Weirather, *A Small MIC Coupler with Good Directivity*, IEEE Trans. on MTT, Jan. 1974, pp. 70, 71.

*Primary Examiner*—Paul Gensler

*Attorney, Agent, or Firm*—Helfgott & Karas, P.C.

[57] ABSTRACT

A high-frequency coupler includes a main transmission line having a microstrip line arranged on a base, a coupling part arranged on the base close to the main transmission line, and a conductive part provided within the base and connected to the coupling part through a throughhole. Therefore, the conductive part is influenced little by external sources.

11 Claims, 15 Drawing Sheets

100
170
120, 121
102
110,111
130

100
160
103
P2
111
141
151
156
D2
116
121 (L2)
131
130
Lo
102
115
120 (L1)
110
P1
D1
140
155
150
101

DASHED LINE PART
IS WITHIN THE BASE

DASHED LINE PART
IS WITHIN THE BASE

FIG. 16

(DISTANCE OF THE CONDENSER: 20mm, FREQUENCY: 800MHz)

| TYPE | CONDITIONS | FEATURES |
|---|---|---|
| 1 | · CAPACITORS: THE SAME CAPACITANCE VALUE<br>· CONDUCTIVE PATTERN: STRAIGHT FORM<br>(FIG. 12) | · INSERTION LOSS IS MINIMUM (≈ 0.1 dB)<br>· DIRECTIONALITY IS GOOD (≈ 20 dB) |
| 2 | · CAPACITORS: THE SAME CAPACITANCE VALUE<br>· CONDUCTIVE PATTERN: SPIRAL COIL FORM<br>(FIGS. 13, 14) | · INSERTION LOSS IS SMALL (≈ 0.12 dB)<br>· SPACE REQUIRED FOR THE CONDUCTIVE PATTERN IS SMALL |
| 3 | · CAPACITORS: DIFFERENT CAPACITANCE VALUE<br>· CONDUCTIVE PATTERN: SPIRAL COIL FORM<br>(FIG. 15) | · DIRECTIONALITY IS GOOD (≈ 15 dB)<br>· SPACE REQUIRED FOR THE CONDUCTIVE PATTERN IS SMALL |

DASHED LINE PART
IS WITHIN THE BASE

HIGH-FREQUENCY COUPLER

This is a continuation of application Ser. No. 08/519,967, filed Aug. 28, 1995 now abandoned.

BACKGROUND OF THE INVENTION

1. Field of the Invention

The present invention generally relates to a high-frequency coupler for deriving a portion of a high-frequency signal such as a microwave signal or a millimeter wave signal from a main transmission line, and more particularly, to a high-frequency coupler constructed with microstrip lines.

2. Description of the Prior Art

In radio equipment, a high-frequency coupler deriving a portion of power of a high-frequency signal is commonly used for a power monitor and an automatic level control (ALC), etc., at an output end of a high-power amplifier of a transmitter. In the ALC, to maintain an output signal of the amplifier at a constant level, a level of an input signal to the high-power amplifier is controlled by a level of the amplified high-frequency signal which is monitored by the high-frequency coupler. More specifically, in a case that the high-frequency coupler is connected to a front end of the transmitter, to prevent an effect of a reflection from an antenna, a directional coupler, which does not couple to a signal of an opposite direction, is generally used.

Such a high-frequency coupler is also applied to a portable-type radio equipment used in mobile communication, and a miniaturization of the coupler is strongly desired in that field. In general, the high-frequency coupler may be constructed with well-known microstrip lines shown in FIG. 1 and FIG. 2.

FIG. 1 shows a pattern structure of a conventional branch-line-hybrid-type directional coupler. A signal applied to an input line 1 is transmitted through a main transmission line 2 and is output from an output line 3. In this case, a portion of the signal is also applied to an output line 6 of a sub-transmission line 5 through parallel lines 7, 8. A ratio of a coupling power Pc in the output line 6 to an input power Pin in the input line 1 ($10\times\log(Pc/Pin)$) is referred to as a coupling ratio, which depends on a material of a base, a width of the pattern, and a frequency. However, the coupling ratio obtained by the coupler shown in FIG. 1 is typically a few dB, for example, approximately −3 dB. It is very difficult to obtain a low coupling ratio of, for example, −20 dB for a restricted-size design.

FIG. 2 shows a pattern structure of a conventional quadrature-hybrid-type directional coupler. A portion of a signal applied to the input line 1 of the main transmission line 2 is coupled to the sub-transmission line 5 by distributed coupling of an edge of a microstrip line, and is supplied to the output line 4. The coupling ratio in this directional coupler also depends on the material of the base, the width of the pattern, and the frequency. And, in the directional coupler shown in FIG. 2, a directionality can be obtained by equalizing phase speeds in quadrature modes of an odd mode and an even mode of a transmission signal. However, since it is difficult to achieve the equalization, there is a problem that a desired directionality cannot be obtained.

In mobile communications using such as a pager, an automobile/portable telephone, and a wireless phone, a usage frequency band is from a hundreds-of-MHz band to a 2-GHz band, which is a lower frequency band than the millimeter wave band. More specifically, in the automobile and portable telephones, an 800-MHz band is mainly used, and a $\lambda g/4$ line length at this frequency is approximately 90 mm in a vacuum. When the conventional microstrip line technologies are applied in such a low-frequency band, the high-frequency coupler may be increased in size. Recently, for a cost reduction of the portable-type radio equipment, a conventional glass epoxy resin is used for the base material. When using this base material, the high-frequency coupler may have a big size of approximately 50 mm.

Further, since the $\lambda g/4$ line is constructed as the coupling pattern in the sub-transmission line, the coupling pattern may operate as an antenna, and thus, the sub-transmission line may be easily influenced by outside sources. In a case of the portable-type radio equipment, a variety of circuits are integrated in a very small area, therefore, the circuits may be easily influenced by a variety of electromagnetic waves.

Recently, serving as a high-frequency coupler which is reduced in size and is influenced little by outside sources, a multilayered-type chip coupler shown in FIG. 3 is being widely used. The chip coupler is small in size and is superior in electrical performance. However, this chip coupler is very expensive for a component used in the portable-type equipment.

Therefore, it is desired to develop a small low-cost high-frequency coupler using the microstrip line technologies. When the high-frequency coupler is constructed using the microstrip line technologies, it is possible to manufacture the high-frequency coupler in the same process as that of high-frequency circuits such as high-frequency amplifiers and high-frequency filters. Therefore, the chip coupler may be unnecessary, and this achieves an overall cost reduction of the high-frequency circuits.

At present, some practical high-frequency couplers using the microstrip line technologies have been proposed. In the following, descriptions will be given of the proposed prior-art high-frequency couplers, by referring to FIG. 4 to FIG. 7.

FIG. 4 shows a pattern structure of an improved prior-art high-frequency coupler. The coupler is disclosed in Japanese Laid-Open Patent Publication No.1-30321 as a "super-high-frequency coupler". In FIG. 4, a part of a signal supplied to the main transmission line 2 is coupled to the sub-transmission line 5 through a coupling part 9 and is output from an output line 6. The sub-transmission line 5 is connected to a ground 12 through two resistances 10, 11 to obtain a good impedance matching for the output line 6. In the coupler shown in FIG. 4, the sub-transmission line 5 is coupled to the main transmission line 2 in a point form, and the coupler may be small in size. The coupling ratio of the coupler is adjustable by a distance between the main transmission line 2 and the coupling part of the sub-transmission line 5. However, this coupler does not have directionality.

FIG. 5 shows a pattern structure of another improved prior-art high-frequency coupler. The coupler is disclosed in Japanese Laid-Open Patent Publication No.4-4763 as a "directional coupler". In FIG. 5, a portion of a signal supplied to the main transmission line 2 is connected to sub-transmission lines 15, 16 through coupling patterns 13, 14, and coupled signals are output from the output line 6. The coupling patterns 13, 14 are respectively connected to ground patterns 19, 20 through termination resistors 17, 18. Each of the ground patterns 19, 20 is connected to ground via a through hole. The termination resistors 17, 18 are provided to stabilize an operation of the directional coupler. This coupler may have a sufficient directionality by adjusting a difference between transmission line lengths between the set of the coupling pattern 13 and the sub-transmission line 15 and the set of the coupling pattern 14 and the sub-transmission line 16 to λg/4. In this coupler, since widths of the sub-transmission lines 15, 16 may be thinned, an influence from outside sources can be reduced. And also, in this coupler, the coupling ratio is adjustable by a distance between the main transmission line 2 and the coupling patterns 13, 14.

FIG. 6 shows a pattern structure of another improved prior-art high-frequency coupler. The coupler is disclosed in Japanese Laid-Open Patent Application No.5-14019 as a "directional coupler". In FIG. 6, in a dielectric board 30, the sub-transmission line 5 is multilayered on the main transmission line 2 with a dielectric therebetween. For a coupling operation, a part of the signal supplied to the main transmission line 2 is coupled to the sub-transmission line 5 through the dielectric, and is supplied to the output line 6. In the above reference, it is described that such a configuration may be useful over an applicable frequency range. And the reference shows that electromagnetic shielding by using these lines as an overcoat may reduce an influence from the outside sources.

FIG. 7 shows a pattern structure of another improved prior-art high-frequency coupler. The coupler is disclosed in Japanese Laid-Open Patent Application No.5-83015 as a "directional coupler". In FIG. 7, a dielectric base 40 is sandwiched between the main transmission line 2 and the sub-transmission line 5, and they are sandwiched between external bases 41, 42, each having a ground side. By the electromagnetic shielding of the coupling part, an influence from outside sources may be reduced.

However, the above-mentioned prior-art high-frequency couplers have the following problems.

In the high-frequency couplers shown in FIGS. 5, 6, and 7, extreme miniaturization for the portable-type equipment may be difficult. When trying to miniaturize the high-frequency coupler shown in FIG. 5, a pitch between the coupling patterns 13, 14 needs to be less than λg/4. In this case, to obtain the good directionality, the widths of the sub-transmission lines 15, 16 further have to be increased. Therefore, it is difficult to reduce an overall size of the high-frequency coupler. As for each of the high-frequency couplers shown in FIGS. 6, 7, since the size of the coupler is determined by λg/4, the reduction in size may cause a large degradation of the electrical performance.

Furthermore, in the high-frequency couplers shown in FIGS. 4, 5, since the sub-transmission line operates as the antenna, the couplers are easily influenced by outside electromagnetic waves. Though the coupler shown in FIG. 5 may be improved by thinning the width of the sub-transmission line, a degree of the influence cannot be reduced to a sufficient low value to be applied to the portable-type radio equipment.

SUMMARY OF THE INVENTION

It is an object of this invention to provide a high-frequency coupler. The size of the coupler can be miniaturized in a frequency band from hundreds of MHz to several GHz. Also, a cost of the coupler can be reduced by using microstrip line technologies. This permits the disadvantages described above to be eliminated.

A more specific object of the present invention is to provide a high-frequency coupler which is influenced little by an external electromagnetic wave.

The object described above is achieved by a high-frequency coupler comprising: a main transmission line having a microstrip line arranged on a base; a coupling part arranged on the base close to the main transmission line; and a conductive part provided within the base and connected to the coupling part through a throughhole.

According to the above high-frequency coupler, a portion of a signal applied to the main transmission line is coupled to the coupling part, and is transmitted to the conductive part through the throughhole. In the high-frequency coupler, when a directionality is unnecessary, a size of the whole high-frequency coupler may not depend on λg/4. Therefore, the high-frequency coupler may be small. More specifically, since the conductive part is formed within the layer of the base, extreme miniaturization is expected. Further, the forming of the conductive part within the layer of the base may prevent an influence from external electromagnetic waves. And, since the coupling part is arranged on the surface of the base, a coupling ratio is adjustable by trimming the coupling part from the outside.

The object described above is also achieved by the high-frequency coupler mentioned above, wherein the coupling part includes two coupling patterns at a first distance apart from each other, the coupling patterns being arranged along the main transmission line, and the conductive part includes two conductive patterns having different line lengths, the conductive patterns being respectively arranged between the two coupling patterns and an output terminal and being connected to the two coupling patterns and the output terminal through throughholes.

According to the above-mentioned high-frequency coupler, the portion of the signal applied to the main transmission line is coupled to the two coupling patterns, and the coupled signals are transmitted to the two conductive patterns through the throughholes. The high-frequency coupler may have a good directionality. When the first distance is set to less than the one-fourth of the wavelength of the microwave, the directionality is degraded, but the whole coupler may be smaller in size. Further, since the coupling patterns are connected to the main transmission line in a point form, the coupler is influenced little from the outside. And, a space to be adjusted from the outside is reduced, and this makes the adjustment easy.

The object described above is also achieved by the high-frequency coupler mentioned above, wherein the coupler further comprises terminating resistances for connecting the two coupling patterns to a ground.

According to the above-mentioned high-frequency coupler, since the two coupling patterns are respectively connected to the ground through the terminating resistances, the coupling operation may be stabilized.

The object described above is also achieved by the high-frequency coupler mentioned above, wherein the first distance corresponds to approximately one-fourth of a wavelength of a microwave used in the coupler, or a difference between line lengths of the two conductive patterns corresponds to approximately one-fourth of a wavelength of a microwave used in the coupler.

According to the above-mentioned high-frequency coupler, the input signal in a forward direction of the main transmission line, after being branched, is combined in the same phases at the output terminal, and the input signal in a backward direction of the main transmission line, after being branched, is combined in the opposite phases at the output terminal. Therefore, desired good directionality may be obtained.

The object described above is also achieved by the high-frequency coupler mentioned above, wherein the coupling part comprises a material which can be trimmed from the outside.

According to the above-mentioned high-frequency coupler, the coupling part of the high-frequency coupler may be easily adjusted by the trimming from the outside.

The object described above is also achieved by the high-frequency coupler mentioned above, wherein the coupler further comprises a capacitor connecting the main transmission line and the coupling part.

According to the above-mentioned high-frequency coupler, the portion of the signal applied to the main transmission line is coupled to the coupling part through the capacitor. The coupled high-frequency signal is transmitted to the conductive part formed within the layer of the base. Therefore, by the coupling of the capacitor, a coupling capacitance may be flexibly set, and the coupling ratio may be widely selected. More specifically, when it is difficult to arrange the coupling part close to the main transmission line and the large coupling capacitance cannot be obtained, the high-frequency coupler may obtain the large coupling ratio by using the capacitor of the large capacitance.

The object described above is also achieved by the high-frequency coupler mentioned above, wherein the coupler further comprises two capacitors having different capacitances or two resistances having different resistive values, each connecting the main transmission line and each of the two coupling patterns.

According to the above-mentioned high-frequency coupler, the portion of the signal applied to the main transmission line is coupled to the two coupling patterns through the capacitors or the resistances. The coupled signals coupled to the two coupling patterns are transmitted to the output terminal through the two conductive patterns formed within the layer of the base, and combined there. When losses of the two conductive patterns are different, amplitudes of the two signals transmitted to the output terminal are equalized to each other by the two capacitors or the two resistances. Therefore, the good directionality may be obtained.

The object described above is also achieved by the high-frequency coupler mentioned above, wherein the coupler further comprises a resistance connecting the main transmission line and the coupling part.

According to the above-mentioned high-frequency coupler, the portion of the signal applied to the main transmission line is coupled to the coupling part through the resistance. The coupled high-frequency signal is transmitted to the conductive part formed within the layer of the base. By the coupling of the resistance, the desired coupling ratio may be obtained over a wide frequency range.

The object described above is also achieved by the high-frequency coupler mentioned above, wherein a portion of the conductive part comprises a spiral coil.

According to the above-mentioned high-frequency coupler, the coupled signal coupled by the coupling part is transmitted to the spiral coil constructing a part of the conductive part. In the high-frequency coupler, since the part of the conductive part is formed in a spiral-coil form, a space necessary for the conductive part may be reduced. Therefore, the spiral coil enables miniaturization of the coupler.

Other objects and further features of the present invention will be apparent from the following detailed description when read in conjunction with the accompanying drawings.

BRIEF DESCRIPTION OF THE DRAWINGS

FIG. 16 shows a table representing features of 3 types of high-frequency couplers;

DESCRIPTION OF THE PREFERRED EMBODIMENTS

Figure 1:
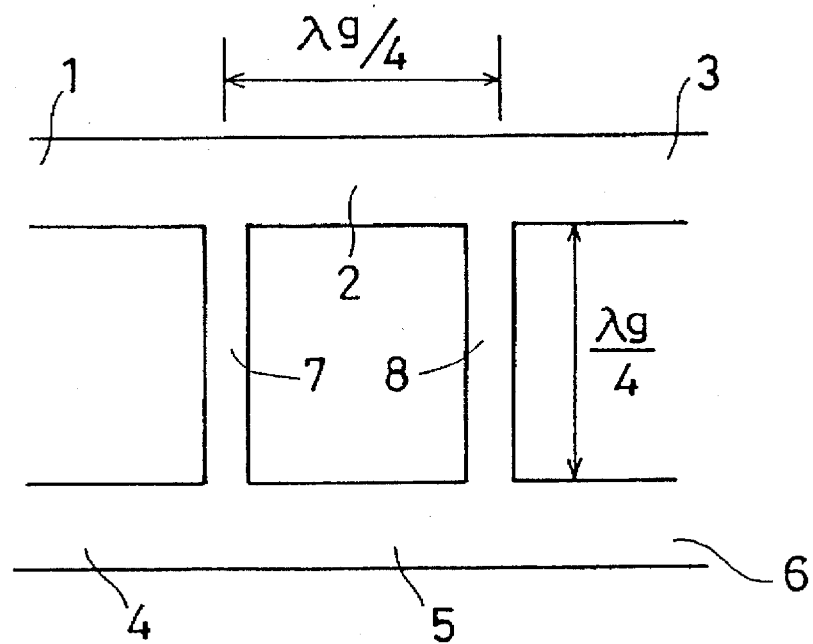
FIG. 1 shows a pattern structure of a conventional branch-line-hybrid-type directional coupler.
Figure 2:
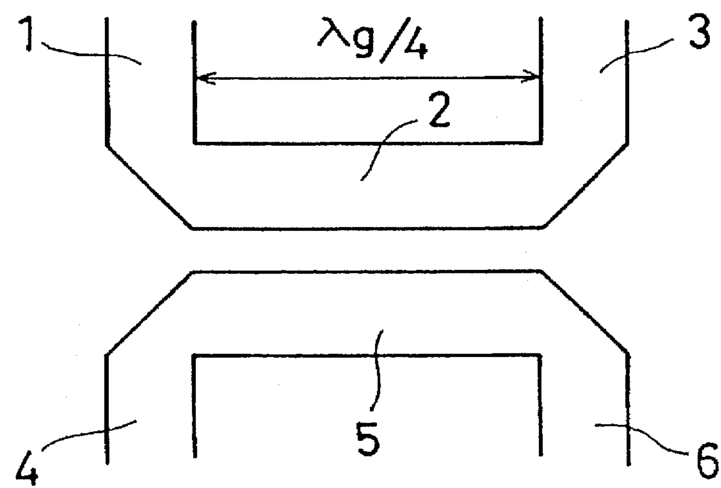
FIG. 2 shows a pattern structure of a conventional quadrature-hybrid-type directional coupler.
Figure 3:
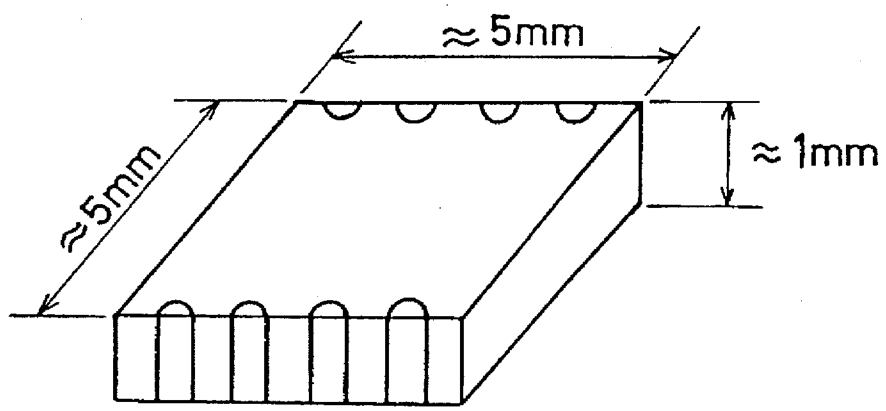
FIG. 3 shows a perspective view of a multi-layered-type chip coupler.
Figure 4:
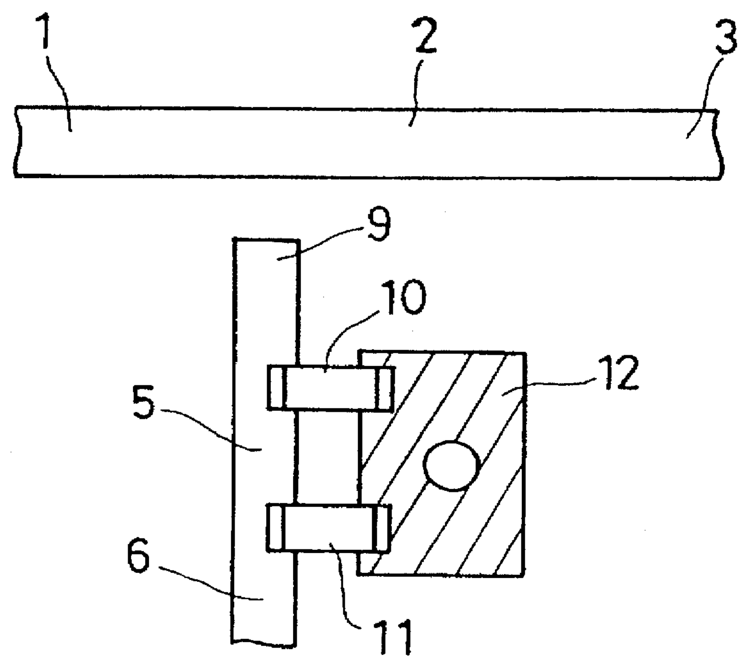
FIG. 4 shows a pattern structure of an improved prior-art high-frequency coupler.
Figure 5:
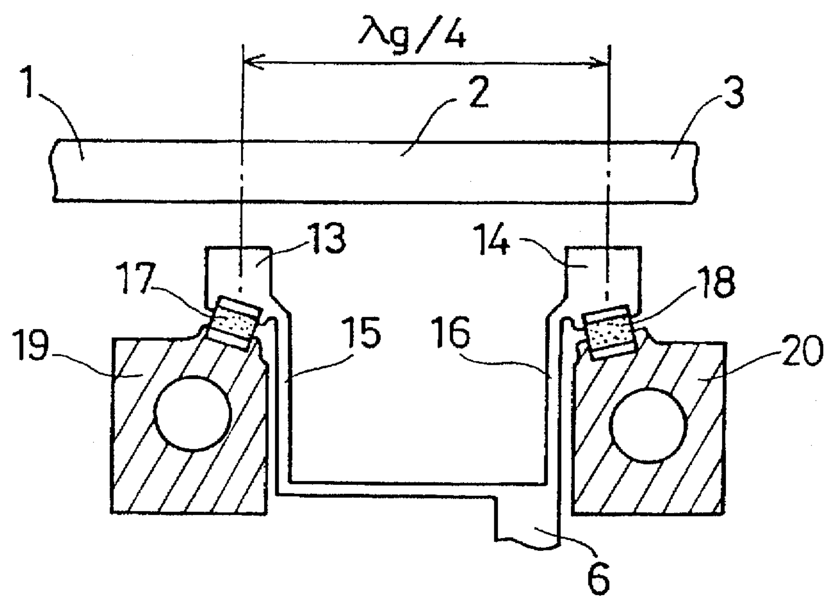
FIG. 5 shows a pattern structure of another improved prior-art high-frequency coupler.
Figure 6:
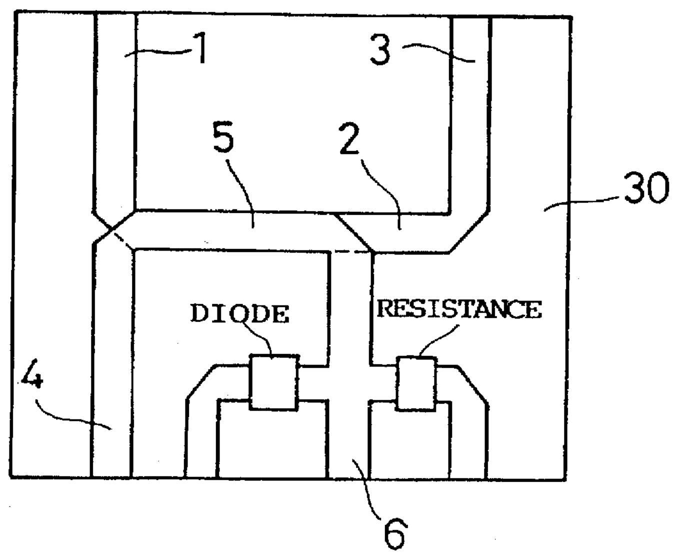
FIG. 6 shows a pattern structure of another improved prior-art high-frequency coupler.
Figure 7:
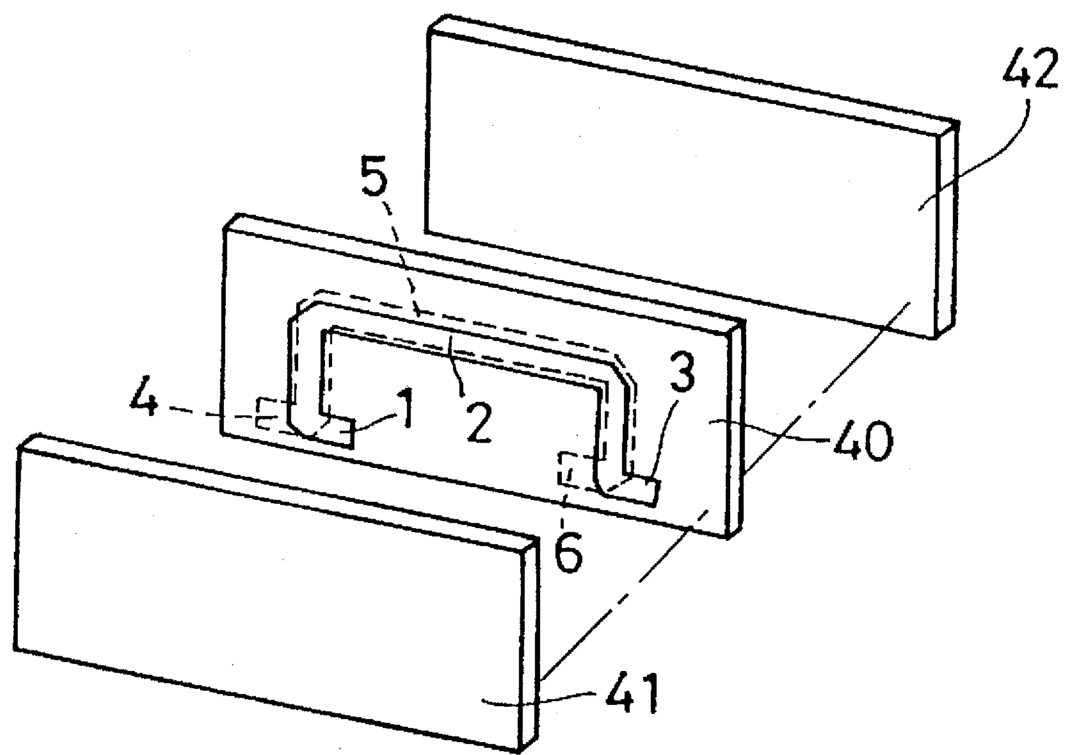
FIG. 7 shows a pattern structure of another improved prior-art high-frequency coupler.
Figure 8B:
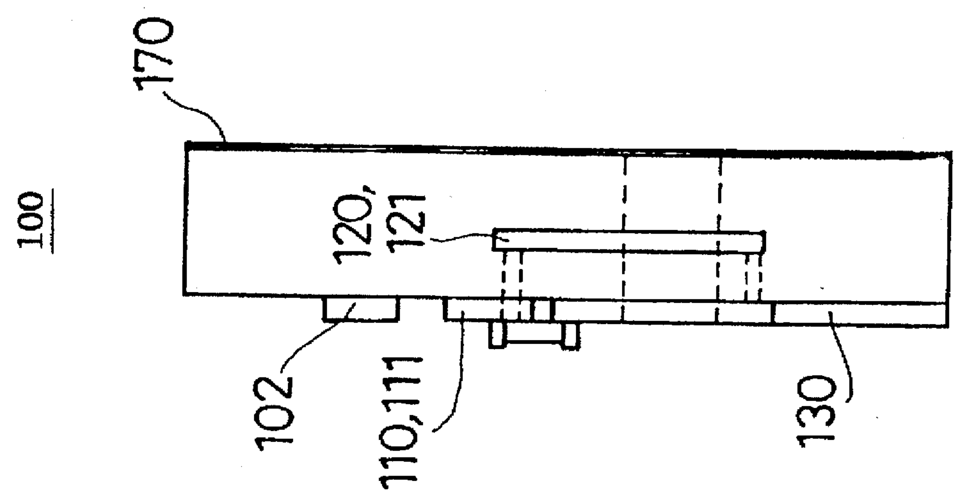
FIG. 8B shows a cross-sectional view of the high-frequency coupler shown in FIG. 8A.
Figure 8A:
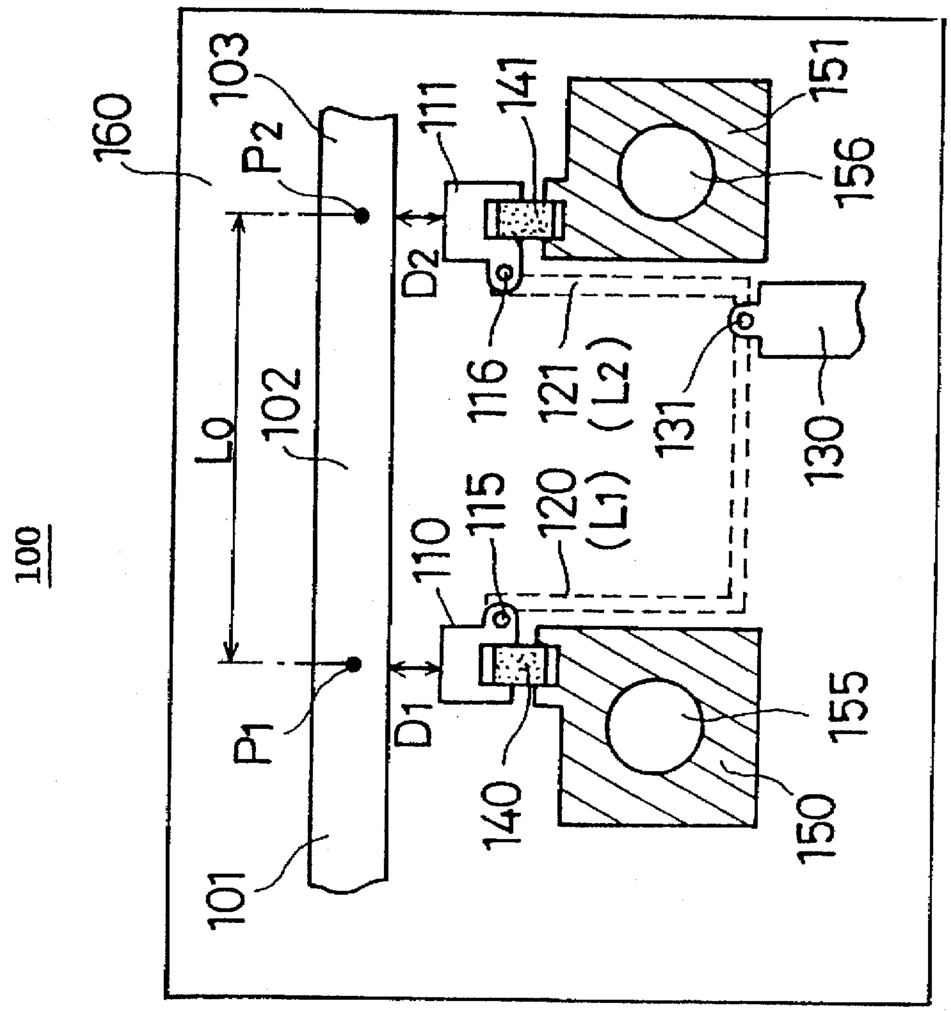
FIG. 8A shows a top plan view of a first embodiment of a high-frequency coupler according to the present invention.

First, a description will be given of a first embodiment of a high-frequency coupler according to the present invention, by referring to FIGS. 8A, 8B. FIG. 8A shows a top plan view of the first embodiment of the high-frequency coupler according to the present invention. FIG. 8B shows a cross-sectional view of the high-frequency coupler shown in FIG. 8A.

In FIG. 8A, a high-frequency coupler 100 comprises a main transmission line 102 having an input line 101 and an output line 103, two coupling patterns 110, 111, two conductive patterns 120, 121 having different lengths, and a coupled-signal output line 130. The coupling pattern 110 is connected to a ground 150 through a resistance 140, the ground 150 being connected to a ground plate 170 through a throughhole 155. In the same way, the coupling pattern 111 is connected to a ground 151 through a resistance 141, the ground 151 being connected to the ground plate 170 through a throughhole 156.

The main transmission line 102 is disposed on a surface of a dielectric base 160. On the same surface of the base 160, the coupling patterns 110, 111 are respectively arranged at given small spaces D1, D2 apart from the main transmission line 102. On the other hand, as shown in FIG. 8B, the conductive patterns 120, 121 are formed within a layer of the dielectric base 160, and are respectively connected to the coupling patterns 110, 111 formed on the base 160 through throughholes 115, 116. The other ends of the conductive patterns 120, 121 formed within the layer of the base 160 are connected in common to the coupled-signal output line 130 formed on the surface of the base 160 through a throughhole 131.

In the following, an operation of the high-frequency coupler 100 will be described.

For example, a high-frequency signal coming from a high-frequency amplifier is typically supplied to the input line 101, and is transmitted in the main transmission line 102, and further is output from the output line 103. The high-frequency signal produced from the output line 103 is supplied to, for example, a high-frequency filter and an antenna. In this case, a portion of the high-frequency signal being transmitted through the main transmission line 102 is coupled to the coupling patterns 110, 111. The coupled high-frequency signals are transmitted through the respective conductive patterns 120, 121 within the layer of the base 160, and are combined at the coupled-signal output line 130. In this way, by combining the signals which have different phases by the transmission through the different-length paths, directionality is obtained. The phases of the signals can be set by a pitch L0 between the two coupling patterns 110, 111, and the lengths L1, L2 of the conductive patterns 120, 121. Therefore, by selecting these lengths properly, a desired directionality may be obtained.

For example, it is assumed that the pitch L0 between the two coupling patterns 110, 111, and the lengths L1, L2 of the conductive patterns 120, 121 are selected as follows:

$$L0=\lambda g/4, L1=L2+\lambda g/4,$$

where $\lambda g$ is a transmission wavelength in the transmission line for the high-frequency signal.

In FIG. 8A, on the above assumption, for a transmission line from a point P1 to the coupled-signal output line 130, the line length ($L1=L2+\lambda g/4$) of the path through the conductive pattern 120 is equal to the line length ($L0+L2=L2+\lambda g/4$) of the path through the main transmission line 102 and the conductive pattern 121. Therefore, the signal applied to the input line 101 is branched at the point P1, and resulting branch signals are combined in the same phases at the coupled-signal output line 130.

On the other hand, for a transmission line from a point P2 to the coupled-signal output line 130, the line length ($L0+L1=L2+\lambda/g/2$) of the path through the main transmission line 102 and the conductive pattern 120 is longer than the line length (L2) of the path through the conductive pattern 121 by the line length $\lambda g/2$. Therefore, the signal applied to the output line 103 is branched at the point P2, and the resulting branch signals are combined in opposite phases at the coupled-signal output line 130. In this case, when amplitudes of both signals at the coupled-signal output line 130 are the same, the combined signal is negated. In this way, the directionality is obtained.

In the high-frequency coupler shown in FIG. 8A, high-frequency signals having different phases are generated by setting different lengths to the conductive patterns 120, 121. Usually, conductive patterns having long lines may be easily influenced by external electromagnetic waves. However, in the high-frequency coupler according to the present invention, since these conductive patterns 120, 121 are formed within the layer of the dielectric base 160 and are shielded, the external influence may be extremely reduced by the shield effect.

A coupling ratio of the high-frequency coupler 100 is determined by the distances D1, D2 between the main transmission line 102 and the coupling patterns 110, 111. Since the coupling patterns 110, 111 appear on the base 160, the above distances D1, D2 are adjustable by trimming, etc. More specifically, since the coupling patterns 110, 111 of the high-frequency coupler 100 are coupled to the main transmission line 102 not in a line form but in a point form, the trimming may be easily carried out. And, if the coupling patterns are made of, for example, a metal or a conductive paste, the trimming may be more easily performed by using a laser.

As mentioned above, in the high-frequency coupler 100, the conductive patterns connected to the coupling patterns are formed within the layer of the base, and, thus, the external influence may be suppressed while keeping the good adjustable performance of the coupling ratio. Therefore, the high-frequency coupler according to the present invention may obtain a stable operation with the desired performance.

Further, in the coupler 100, the coupling patterns 110, 111 are terminated through the resistances 140, 141, and this also establishes a more stable operation.

In the above description of the operation of the high-frequency coupler 100, it is assumed that the pitch L0 between the coupling patterns 110, 111 is $\lambda g/4$. Though in the case of the pitch L0 of $\lambda g/4$, a best directionality is obtained, the high-frequency coupler according to the present invention is not limited to one having the pitch L0 of $\lambda g/4$. In the portable-type radio equipment, it is not easy to set the pitch L0 to $\lambda g/4$ because a space for mounting the high-frequency coupler is restricted.

For example, it is assumed that the pitch L0 is $\lambda g/8$. In this case, when L1 is set as follows: $L1=L2+3\ \lambda g/8$, the signal applied to the output line 103 is, after being branched, combined in opposite phases at the coupled-signal output line 130, but the signal applied to the input line 101 is, after being branched, combined by a phase difference of 90° at the coupled-signal output line 130. Therefore, as compared to the previous example, the level of the combined signal in this example is reduced, and the coupling ratio and the directionality therein are also degraded. However, since the pitch L0 of this example is set to a half of that of the previous example, the required space on the surface of the base may be a half of that of the previous example, and, thus, this enables extreme miniaturization of the high-frequency coupler.

Further, the high-frequency coupler 100 has an advantage that the lengths of the conductive patterns 120, 121 can be extended since the conductive patterns 120, 121 are formed within the layer of the base 160. Namely, the lengths of the conductive patterns may be extended and the required space for mounting them on the surface of the base may be reduced. This reduction contributes to the overall miniaturization of the radio equipment.

In the high-frequency coupler 100, by arranging the coupling patterns 110, 111 closer to the main transmission line 102, the level of the coupled signal may be increased. Therefore, the pitch between the coupling patterns 110, 111 and the distances between the coupling patterns 110, 111 and the main transmission line 102 are determined by a trade-off in the electrical performance between such as the coupling ratio and the directionality.

The high-frequency coupler 100 may be used for the high-frequency signals ranging from hundreds of MHz to several GHz. More specifically, the high-frequency coupler 100 effectively operates for the 800-MHz band signal typically used in the mobile communication.

And, as the material of the dielectric base 160, the glass epoxy and Teflon glass are practically usable.

Next, a description will be given of the coupling ratio of the high-frequency coupler in the case of using the glass epoxy as the material of the dielectric base. In this case, the gaps D1, D2 between the main transmission line 102 and the coupling patterns 110, 111 are set to larger than approximately 0.1 mm by restriction from the manufacturing process. And it is assumed that the width of each coupling pattern is set to 1.5 mm for impedance matching.

Figure 9:
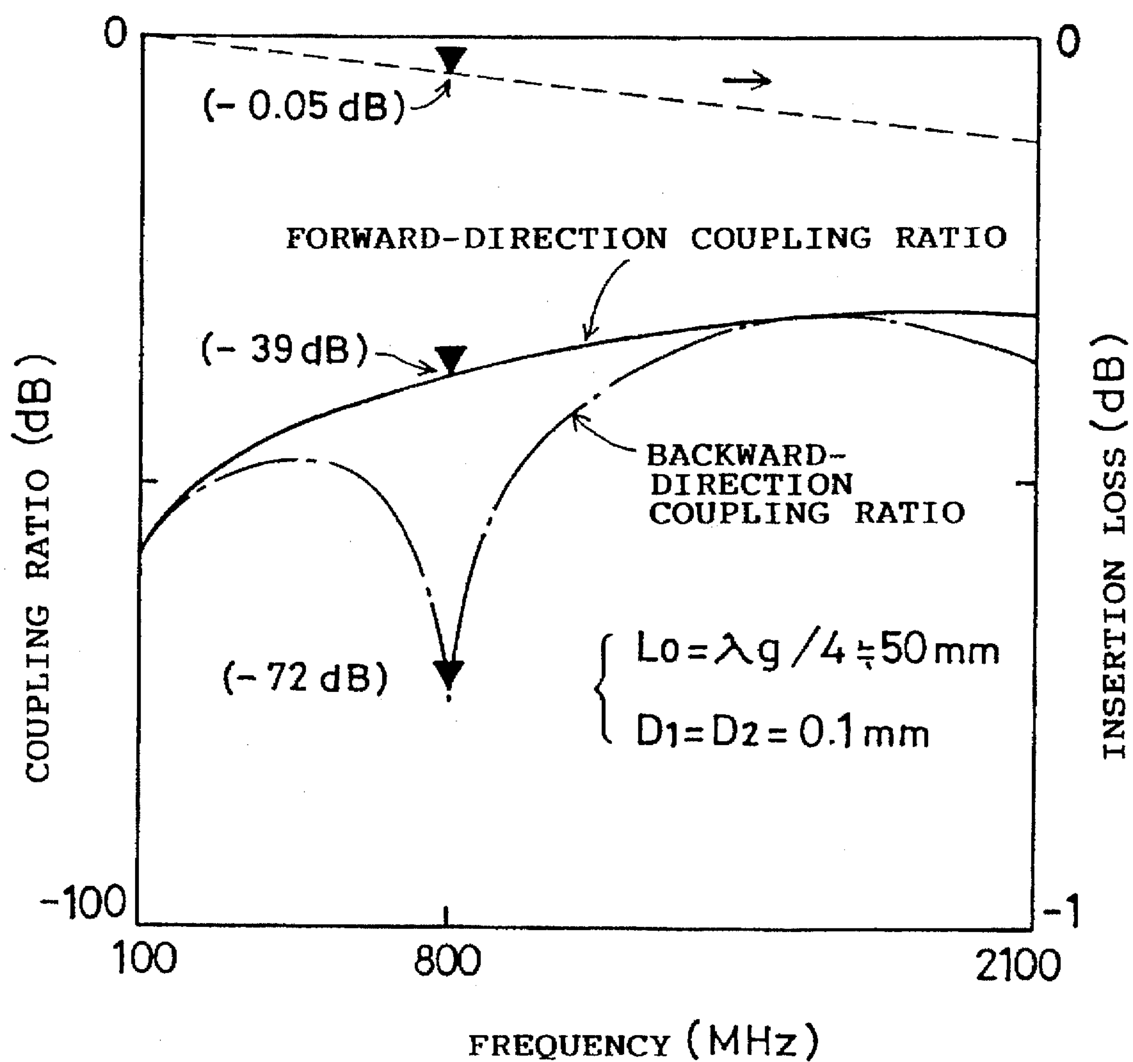
FIG. 9 shows a simulation result of electrical performance of the first embodiment of the high-frequency coupler in a case gaps D1, D2 are 0.1 mm.

FIG. 9 shows a simulation result of the electrical performance of the first embodiment of the high-frequency coupler in a case the gaps D1, D2 are 0.1 mm. In this case, the pitch L0 between the coupling patterns is set to λg/4. The horizontal axis is a frequency range from 100 MHz to 2.1 GHz. In FIG. 9, a frequency marked by a marker "▼" is 800 MHz. The vertical axis represents a forward-direction coupling ratio (dB) for the input signal to the input line 101, and a backward-direction coupling ratio (dB) for the input signal to the output line 103.

In FIG. 9, the forward-direction coupling ratio at 800 MHz is approximately −39 dB. This value is extremely low since a forward-direction coupling ratio larger than −20 dB is required for the mobile communication. A reason for the above was found by a simulation and is that a coupling capacitance between the coupling patterns and the main transmission line is very small (0.045 pF). In this case, an impedance at 800 MHz is large (4kΩ) by an equation $Z=1/\omega C$. Namely, for obtaining the high coupling ratio, the gap between the coupling patterns and the main transmission line needs to be decreased to less than 0.1 mm.

A description will now be given of a second embodiment of the high-frequency coupler which has an improved performance as compared to the first embodiment of the high-frequency coupler.

Figure 10:
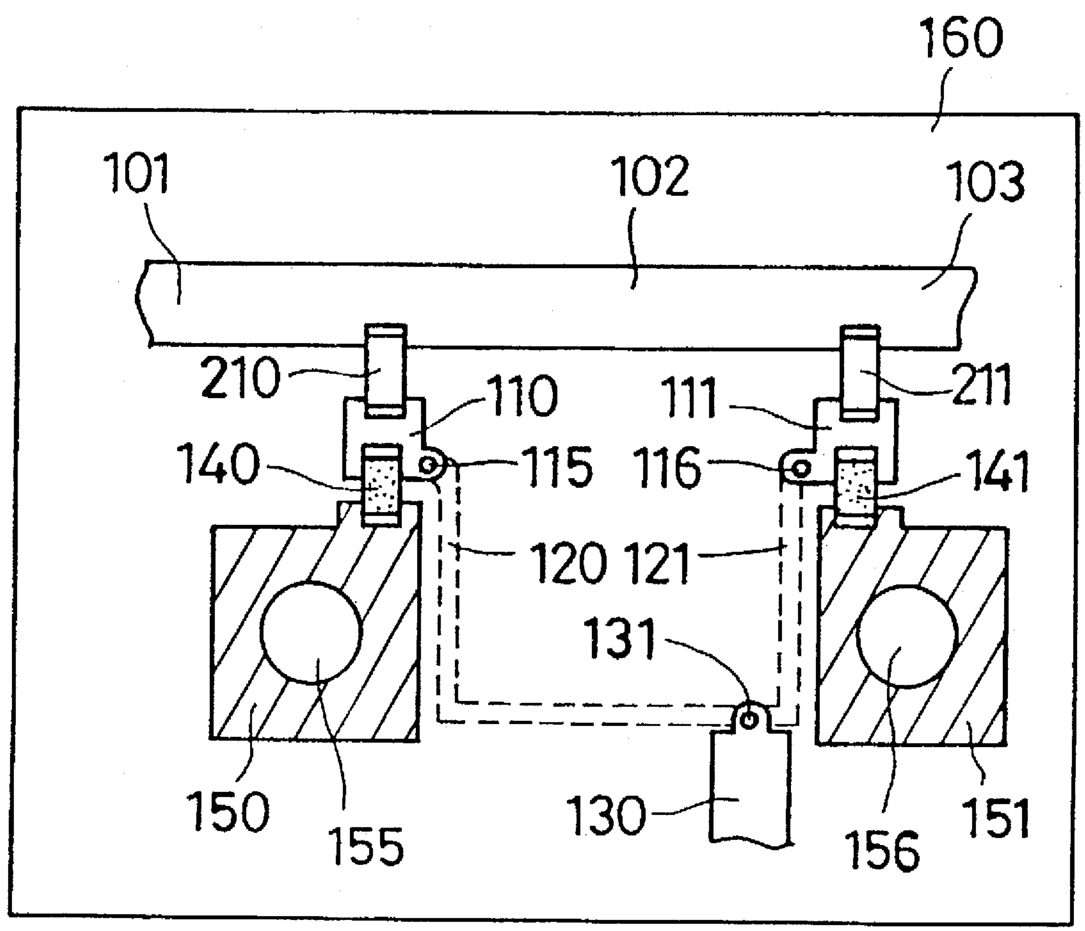
FIG. 10 shows a top plan view of a second embodiment of the high-frequency coupler according to the present invention.

FIG. 10 shows a top plan view of the second embodiment of the high-frequency coupler according to the present invention. A high-frequency coupler 200 has almost the same configuration as that of the high-frequency coupler 100 shown in FIG. 8A. Elements in FIG. 10 which are the same as those of FIG. 8A are given the same reference numerals. More specifically, in the high-frequency coupler 200, the coupling patterns 110, 111 are connected to the main transmission line 102 through capacitors 210, 211. For the capacitors 210, 211, chip-type capacitors are usable.

In the high-frequency coupler 200, the high-frequency signal being transmitted through the main transmission line 102 is coupled to the coupling patterns 110, 111 through the capacitors 210, 211, and the coupled signals are respectively supplied to the conductive patterns 120, 121. The operation after that and the operation for obtaining the directionality are the same as that in the high-frequency coupler 100 shown in FIG. 8A. Therefore, the high-frequency coupler 200 may have the same advantages as the high-frequency coupler 100.

In the high-frequency coupler 200, since the capacitors are used for means for coupling the high-frequency signal, the coupling capacitance may be flexibly set. On the contrary, in the high-frequency coupler 100, it is difficult to obtain a coupling capacitance larger than 0.05 pF for the dielectric base 160 of the glass epoxy. However, in the high-frequency coupler 200, such large coupling capacitance may be easily obtained.

Figure 11:
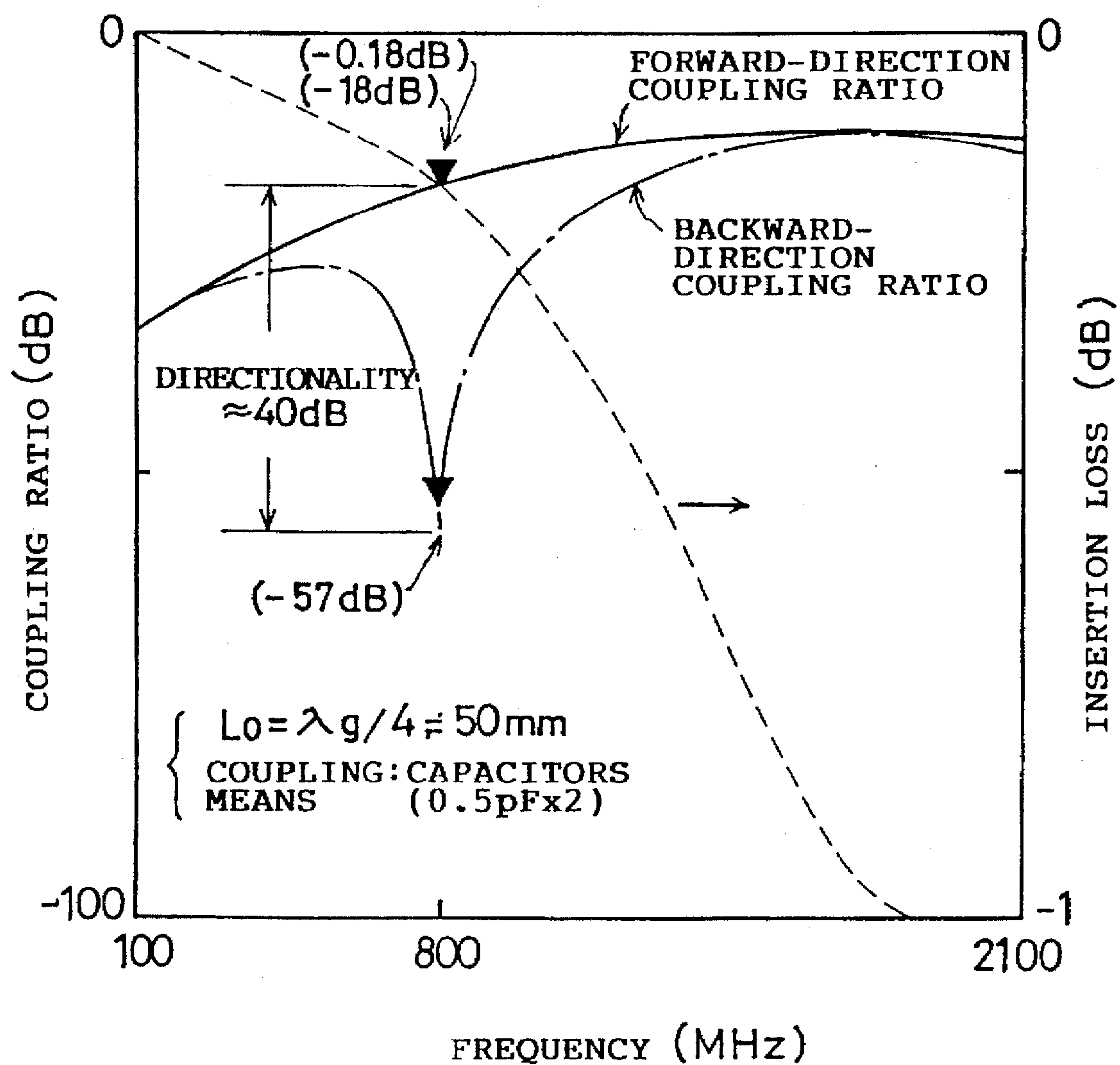
FIG. 11 shows a simulation result of electrical performance of the second embodiment of the high-frequency coupler in a case 0.5-pF capacitors are used as coupling means.

FIG. 11 shows a simulation result of electrical performance of the second embodiment of the high-frequency coupler in a case 0.5 pF capacitors are used as the coupling means. In FIG. 11, the pitch L0 between the coupling patterns, namely a distance between the capacitors 210, 211, is λg/4. The forward-direction coupling ratio at 800 MHz is approximately −18 dB, which is applicable for the mobile communication equipment. In this case, by properly setting the lengths of the conductive patterns 120, 121 formed within the layer of the base, a directionality of approximately 40 dB may be obtained.

In this way, by using the capacitors for the means for coupling the high-frequency signal and by using the glass epoxy base, it becomes possible to obtain a good performance suitable for the signal at the frequency used in the mobile communication.

To further miniaturize the high-frequency coupler 200, as mentioned in the description of the high-frequency coupler 100, it is effective to form a shorter pitch between the coupling patterns.

Figure 12:
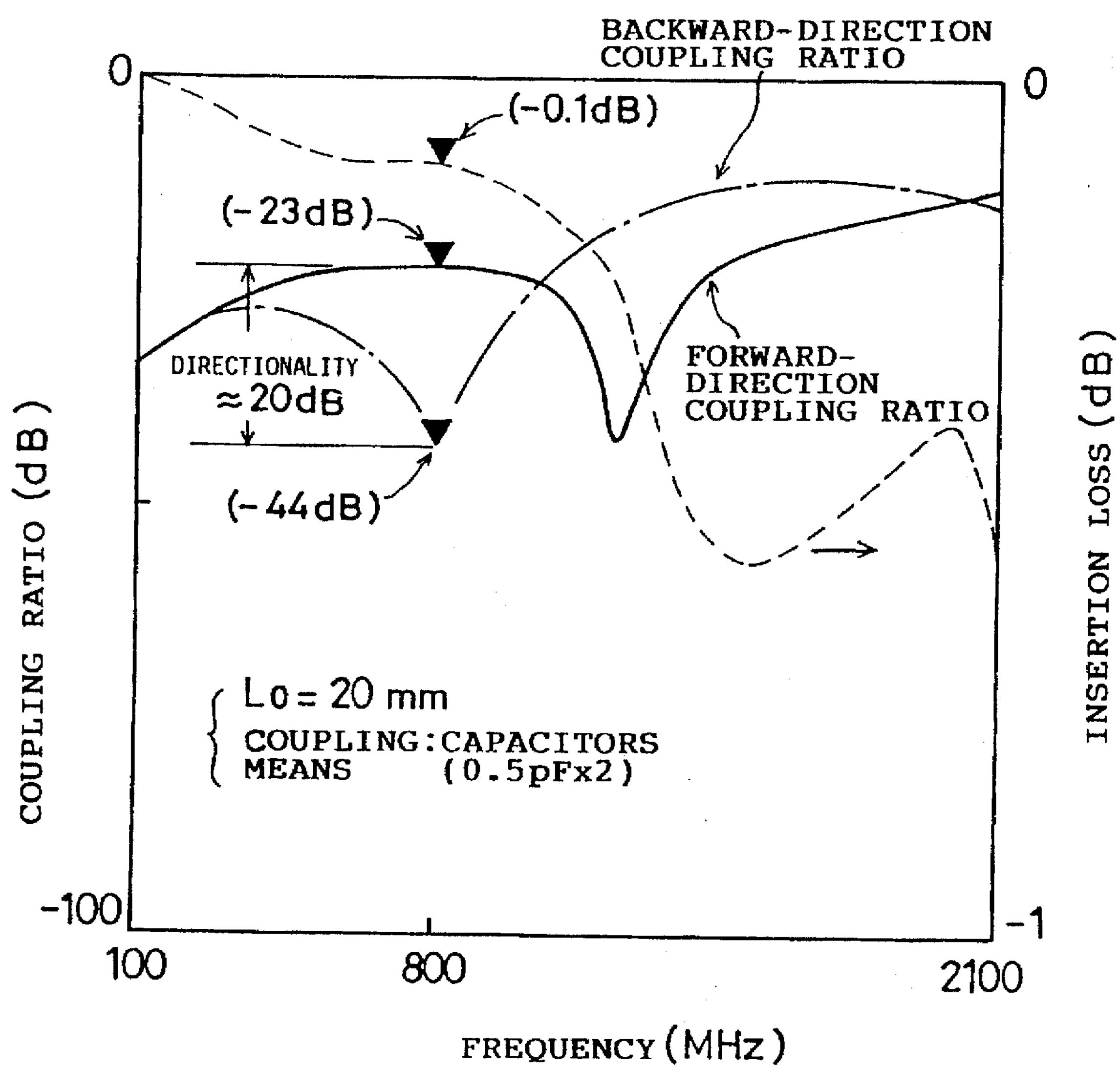
FIG. 12 shows a simulation result of electrical performance of the second embodiment of the high-frequency coupler in a case a pitch between coupling patterns is 20 mm.

FIG. 12 shows a simulation result of electrical performance of the second embodiment of the high-frequency coupler in a case the pitch between the coupling patterns is 20 mm, and the capacitors 210, 211 are respectively 0.5 pF. The pitch between the coupling patterns of 20 mm is less than a half of λg/4 (approximately 50 mm at 800 MHz).

In FIG. 12, the forward-direction coupling ratio at 800 MHz is approximately −23 dB, which is degraded by 5 dB as compared to the circuit shown in FIG. 11, but is still applicable to the mobile communication equipment. However, to ensure a good directionality, the conductive pattern 120 needs to be extended. As a result of the simulation, to obtain a directionality of 20 dB, the glass epoxy base is required to have the conductive pattern 120 of a length of approximately 70 mm. For the base made of another material having a smaller dielectric ratio than that of the glass epoxy, a longer conductive pattern, for example, a 100-mm conductive pattern is required.

Figure 13:
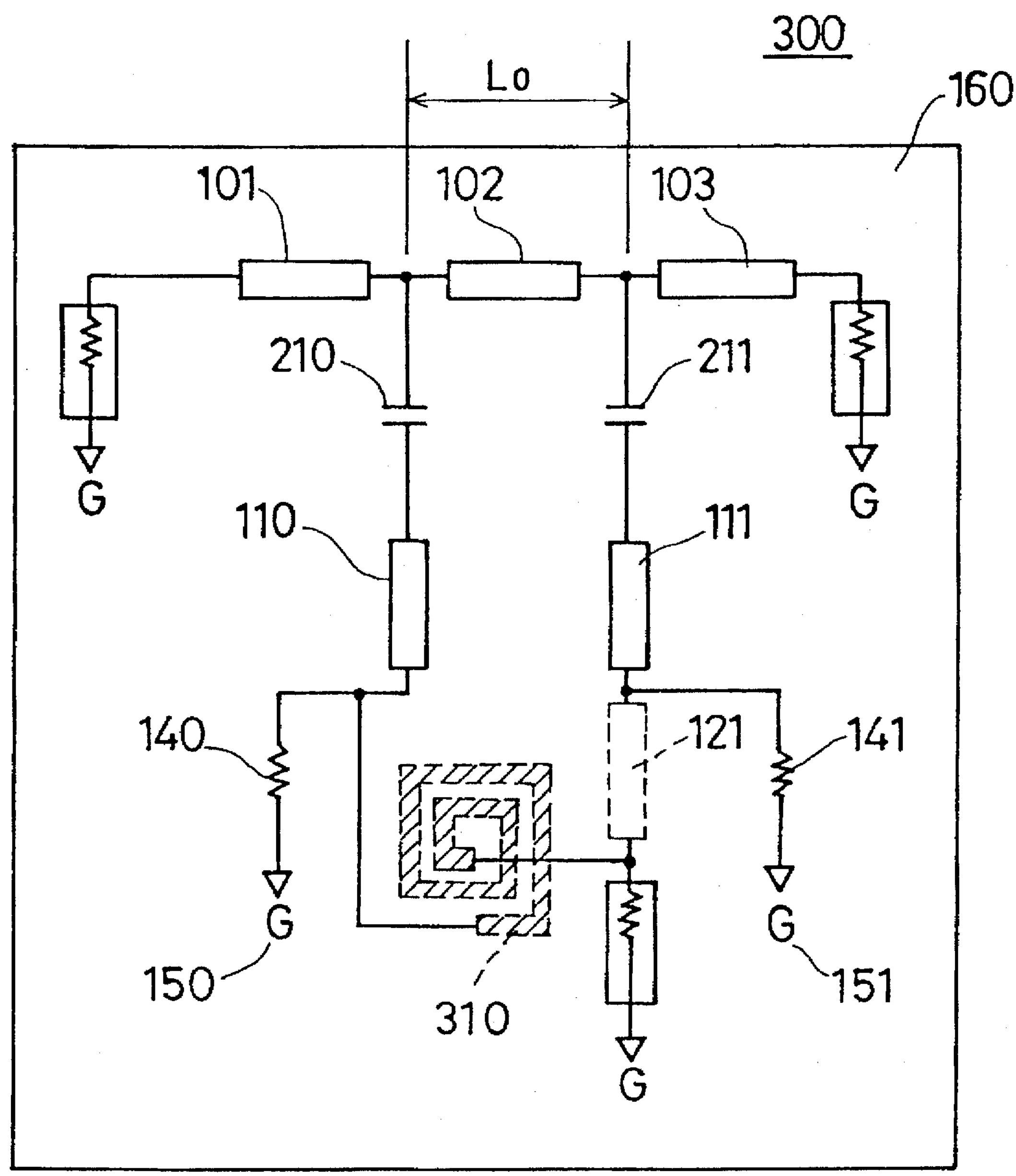
FIG. 13 shows a top plan view of a third embodiment of the high-frequency coupler according to the present invention.

Next, a description will be given of a third embodiment of the high-frequency coupler in which the above-mentioned long conductive pattern can be mounted in a small space. FIG. 13 shows a top plan view of the third embodiment of the high-frequency coupler according to the present invention. A high-frequency coupler 300 has almost the same configuration as that of the high-frequency coupler 200 shown in FIG. 10. Elements in FIG. 13 which are the same as those of FIG. 10 are given the same reference numerals. More specifically, in the high-frequency coupler 300, a conductive pattern 310 formed by a spiral coil is used instead of the conductive pattern 120 shown in FIG. 10. Namely, the spiral coil 310 and the conductive pattern 121 are formed within the layer of the base 160. Though the spiral coil 310 needs a larger space than that for the conductive pattern 121, there is no need for the large space on the surface of the base 160 since the spiral coil 310 is formed within the layer of the base 160. Therefore, this enables extreme overall miniaturization of the high-frequency coupler.

Figure 14:
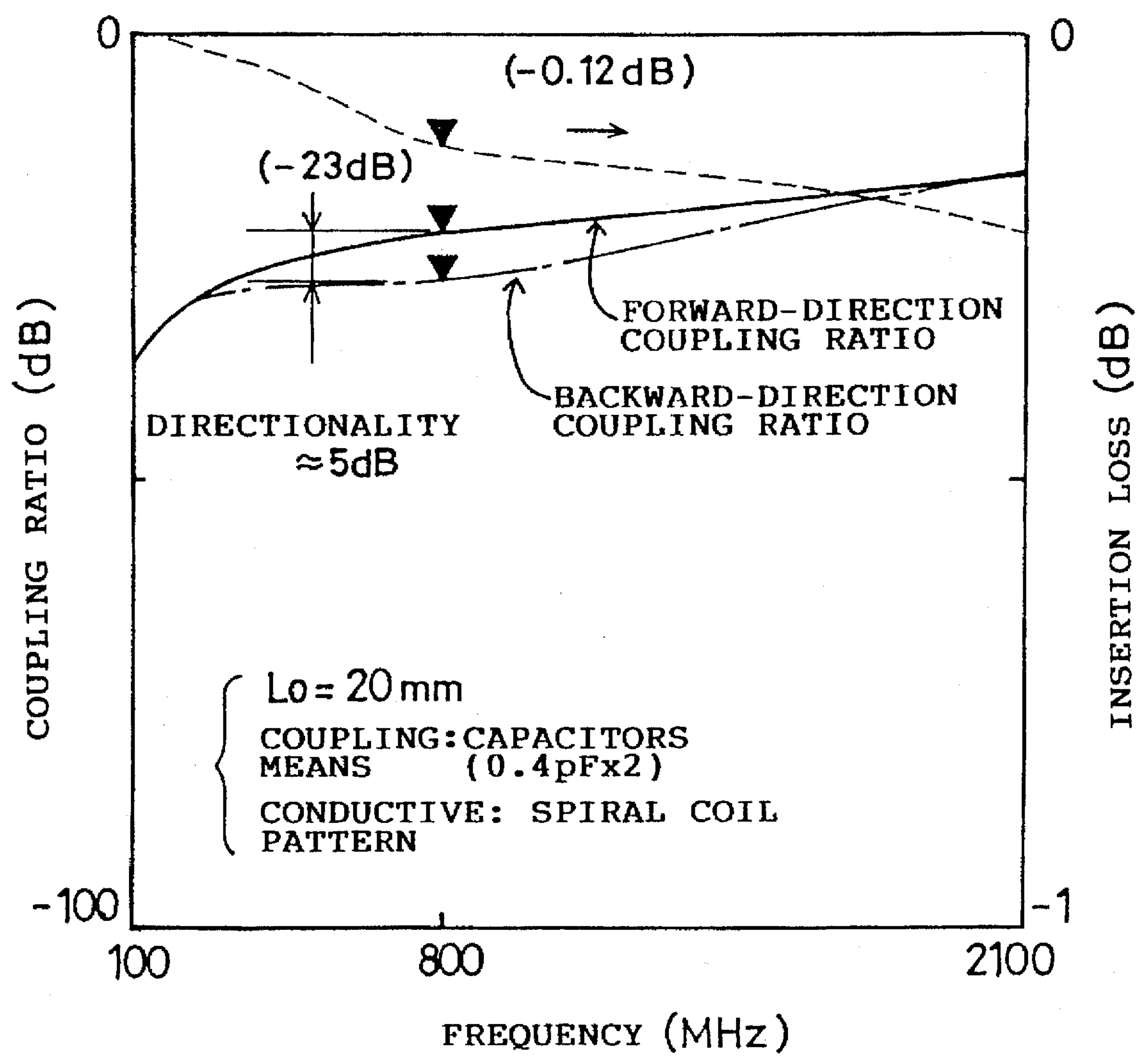
FIG. 14 shows a simulation result of electrical performance of the third embodiment of the high-frequency coupler in a case a spiral coil is used as a conductive pattern.

FIG. 14 shows a simulation result of electrical performance of the third embodiment of the high-frequency coupler in a case of using the spiral coil as the conductive pattern, where the pitch between the coupling patterns is 20 mm. In this case, by setting capacitance values of the capacitors 210, 211 to respectively 0.4 pF, the same coupling ratio (approximately 23 dB) as the circuit shown in FIG. 12 may be obtained. As a result of the simulation, it is shown that the 100-mm conductive pattern can be formed by the spiral coil of 10 mm×10 mm. This reveals that for the miniaturization of the coupler, the application of the spiral coil is effective.

On the other hand, FIG. 14 shows that the directionality at 800 MHz is degraded to approximately 5 dB. Since a loss of the spiral coil is larger than a loss of the conventional line used in the conductive pattern 120, the two signals through two paths from the output line 103 to the coupled-signal output line 130 have different amplitudes. Though the two signals have the opposite phases at the coupled-signal output line 130, the combined signal is not negated by the difference between the amplitudes of the two signals. Therefore, the backward-direction coupling ratio becomes larger, and the directionality is degraded.

To improve the directionality, the two capacitors 210, 211 having different capacitances may be used in the high-frequency coupler shown in FIG. 13. For the path having a large loss due to the spiral coil, a larger capacitance value capacitor needs to be connected to the path.

Figure 15:
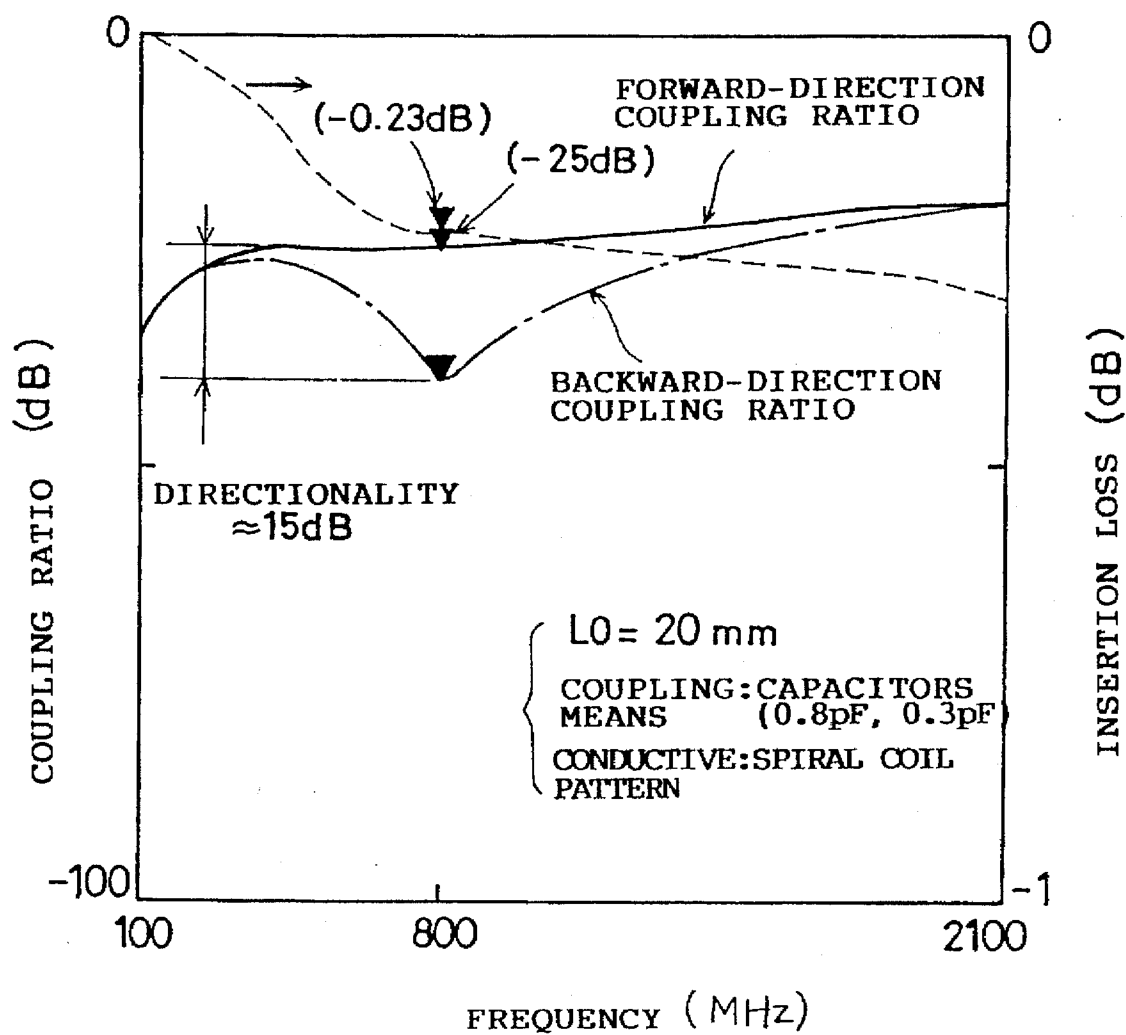
FIG. 15 shows a simulation result of electrical performance of the third embodiment of the high-frequency coupler in a case of using two capacitors having different capacitances.

FIG. 15 shows a simulation result of electrical performance of the third embodiment of the high-frequency coupler in the case of using two capacitors having the different capacitances, where capacitances of 0.8 pf, 0.3 pF are respectively used for the capacitors 210, 211. As shown in FIG. 15, almost the same coupling ratio (approximately 25 dB) as that in the coupler shown in FIG. 13 is obtained, but the directionality at 800 MHz is approximately 15 dB, which is improved by approximately 10 dB as compared to the coupler shown in FIG. 13. However, the insertion loss is increased by approximately 0.1 dB as compared to the coupler shown in FIG. 13. The above results show that the application of two capacitors having the different capacitances is effective to improve the directionality.

In the following, a summary will be made of the above-mentioned 3 types of high-frequency couplers, a type 1 referring to FIG. 12, a type 2 referring to FIGS. 13, 14, and a type 3 referring to FIG. 15.

FIG. 16 shows a table representing features of the 3 types of high-frequency couplers, where the distance between the capacitors 210, 211 is 20 mm, and the frequency is 800 MHz. Taking the respective features into account, the 3 types of high-frequency couplers need to be respectively used according to applications as mentioned below.

(1) type 1: for an application requiring a good electrical performance and accommodating a larger space, (2) type 2: for an application requiring good insertion loss performance and limited to a narrow space, (3) type 3: for an application requiring good directionality and limited to the narrow space.

In each of the high-frequency couplers using the coupling means by the capacitors shown in FIGS. 10 to 15, there is on average a 20-dB variation of the performance an the frequency range from 100 MHz to 2.1 GHz, which does not reveal the good performance. However, the frequency performance may be improved by using resistances as the coupling means instead of the capacitors.

Figure 17:
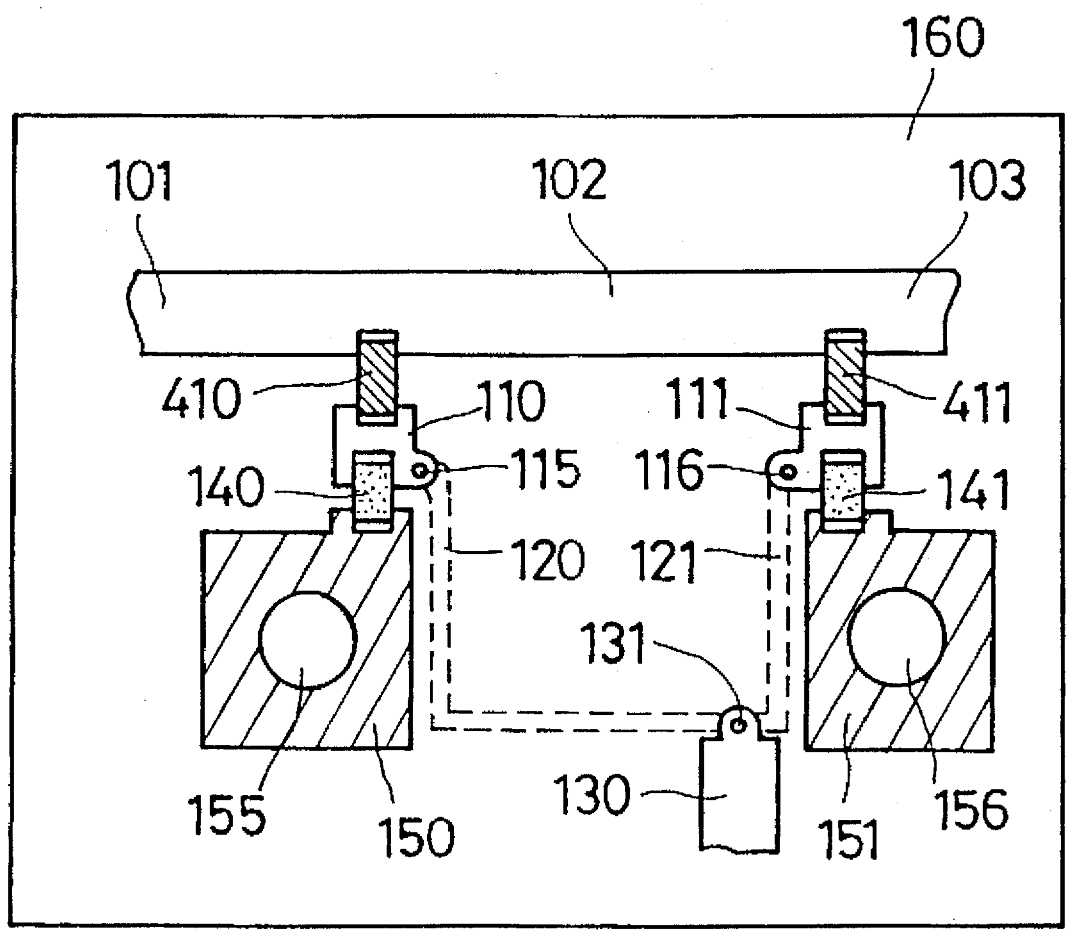
FIG. 17 shows a top view of a fourth embodiment of the high-frequency coupler according to the present invention using resistances for the coupling means.

FIG. 17 shows a top view of a fourth embodiment of the high-frequency coupler according to the present invention using the resistances for the coupling means. In a high-frequency coupler 400, resistances 410, 411 are used for the means for coupling the main transmission line 102 to the coupling patterns 110, 111. For the resistances 410, 411, chip resistances can be used, each having almost the same size as that of the chip capacitor used in the high-frequency coupler 200 shown an FIG. 10. The high-frequency coupler 400 has the same configuration as that of the high-frequency coupler 300 except for the resistances 410, 411. Elements in FIG. 17 which are the same as those of the high-frequency coupler 300 are given the same reference numerals.

Figure 18:
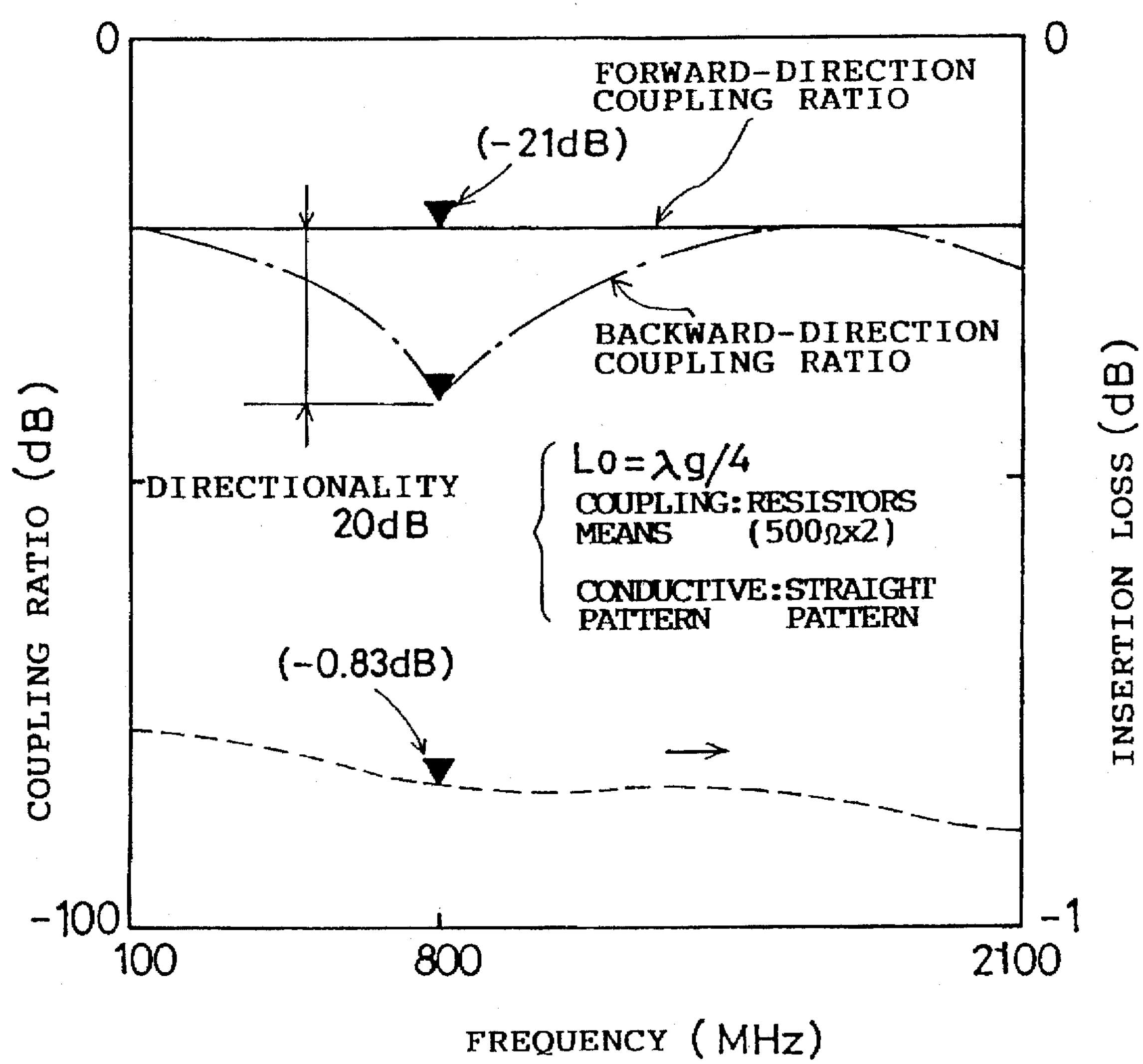
FIG. 18 shows a simulation result of electrical performance of the fourth embodiment of the high-frequency coupler.

FIG. 18 shows a simulation result of electrical performance of the fourth embodiment of the high-frequency coupler, where the value of each of the resistances 410, 411 is 500 Ω, and a distance between the resistances 410, 411 is λg/4. As shown in FIG. 18, the insertion loss at 800 MHz is 0.83 dB, which is degraded as compared to the high-frequency coupler 200 shown in FIG. 10, however, for the coupling ratio, a flat performance at approximately −21 dB is obtained in the frequency range from 100 MHz to 2.1 GHz.

As mentioned above, in the high-frequency coupler 400 using the resistances for the coupling means, the good flat frequency performance for the coupling ratio may be obtained. Further, in the same way as for the high-frequency coupler 300, the high-frequency coupler 400 may also be miniaturized by using the spiral coil for the conductive pattern.

Furthermore, by differentiating the values of the resistances 410, 411, the directionality may be further improved.

Further, the present invention is not limited to these embodiments, but various variations and modifications may be made without departing from the scope of the present invention.

What is claimed is:

1. A high-frequency coupler comprising:

a dielectric base;

a main transmission line having a microstrip line arranged on said dielectric base;

a first and second coupling pattern arranged on said dielectric base close to said main transmission line so as to couple power from said main transmission line to said coupling patterns; and conductive pattern means provided within said dielectric base and connected to said coupling patterns through a throughhole to prevent influence from external electromagnetic waves;

wherein the power coupled from said main transmission line to said coupling patterns is transmitted externally of the coupler through said conductive pattern means provided within said dielectric base.

2. A high-frequency coupler comprising:

a dielectric base;

a main transmission line having a microstrip line arranged on said dielectric base;

coupling pattern means arranged on said dielectric base close to said main transmission line so as to couple power from said main transmission line to said coupling pattern means; and conductive pattern means provided within said dielectric base and connected to said coupling pattern means through a throughhole to prevent influence from external electromagnetic waves;

wherein the power coupled from said main transmission line to said coupling pattern means is transmitted externally of the coupler through said conductive pattern means provided within said dielectric base, and wherein said coupling pattern means includes first and second coupling patterns positioned at a first distance apart from each other, said first and second coupling patterns being arranged along said main transmission line, and said conductive pattern means includes first and second conductive patterns having different line lengths, said first and second conductive patterns being respectively arranged between said first and second coupling patterns and an output terminal and being connected to the first and second coupling patterns and the output terminal through throughholes.

3. The high-frequency coupler as claimed in claim 2, wherein said coupler further comprises terminating resistances for connecting said first and second coupling patterns to a ground.

4. The high-frequency coupler as claimed in claim 2, wherein said first distance corresponds to approximately one-fourth of a wavelength of a microwave used in the coupler.

5. The high-frequency coupler as claimed in claim 2, wherein a difference between the line lengths of said first and second conductive patterns corresponds to approximately one-fourth of a wavelength of a microwave used in the coupler.

6. The high-frequency coupler as claimed in claim 2, wherein said coupling pattern means comprises a material which can be trimmed from the outside.

7. The high-frequency coupler as claimed in claim 2, wherein said coupler further comprises first and second resistances having different capacitances, each connecting said main transmission line to each of said first and second coupling patterns.

8. The high-frequency coupler as claimed in claim 2, wherein said coupler further comprises first and second resistances having different resistive values, each connecting said main transmission line to respective one of said first and second coupling patterns.

9. A high-frequency coupler comprising:

a dielectric base;

a main transmission line having a microstrip line arranged on said dielectric base;

coupling pattern means arranged on said dielectric base close to said main transmission line so as to couple power from said main transmission line to said coupling pattern means; and conductive pattern means provided within said dielectric base and connected to said coupling pattern means through a throughhole to prevent influence from external electromagnetic waves;

wherein the power coupled from said main transmission line to said coupling pattern means is transmitted externally of the coupler through said conductive pattern means provided within said dielectric base, and a capacitor connecting said main transmission line to said coupling pattern means.

10. A high-frequency coupler comprising:

a dielectric base;

a main transmission line having a microstrip line arranged on said dielectric base;

coupling pattern means arranged on said dielectric base close to said main transmission line so as to couple power from said main transmission line to said coupling pattern means; and conductive pattern means provided within said dielectric base and connected to said coupling pattern means through a throughhole to prevent influence from external electromagnetic waves;

wherein the power coupled from said main transmission line to said coupling pattern means is transmitted externally of the coupler through said conductive pattern means provided within said dielectric base, and a resistance connecting said main transmission line to said coupling pattern means.

11. A high-frequency coupler comprising:

a dielectric base;

a main transmission line having a microstrip line arranged on said dielectric base;

a first and second coupling pattern arranged on said dielectric base close to said main transmission line so as to couple power from said main transmission line to said coupling patterns; and conductive pattern means provided within said dielectric base and connected to said coupling patterns through a throughhole to prevent influence from external electromagnetic waves;

wherein the power coupled from said main transmission line to said coupling patterns is transmitted externally of the coupler through said conductive pattern means provided within said dielectric base, and wherein a portion of said conductive pattern means comprises a spiral coil.

* * * * *